United States Patent
Zhang et al.

(10) Patent No.: US 10,625,473 B2
(45) Date of Patent: Apr. 21, 2020

(54) FERROELECTRIC POLYMER ELECTROCALORIC MATERIAL AND PREPARATION METHOD THEREOF

(71) Applicant: Huazhong University of Science and Technology, Wuhan (CN)

(72) Inventors: Guangzu Zhang, Wuhan (CN); Zhaoyao Hu, Wuhan (CN); Lingxi Weng, Wuhan (CN); Shenglin Jiang, Wuhan (CN); Mingyu Li, Wuhan (CN)

(73) Assignee: Huazhong University of Science and Technology, Wuhan (CN)

( * ) Notice: Subject to any disclaimer, the term of this patent is extended or adjusted under 35 U.S.C. 154(b) by 33 days.

(21) Appl. No.: 15/972,658

(22) Filed: May 7, 2018

(65) Prior Publication Data
US 2019/0248708 A1    Aug. 15, 2019

(30) Foreign Application Priority Data
Feb. 9, 2018   (CN) .................. 2018 1 01345661

(51) Int. Cl.
| | | |
|---|---|---|
| B29C 44/18 | (2006.01) | |
| B29C 65/00 | (2006.01) | |
| C04B 35/10 | (2006.01) | |
| C08J 3/11 | (2006.01) | |
| C04B 35/634 | (2006.01) | |
| C04B 35/64 | (2006.01) | |
| C25D 11/04 | (2006.01) | |
| H01L 41/45 | (2013.01) | |
| B29C 44/12 | (2006.01) | |
| C25D 11/18 | (2006.01) | |
| H01L 41/193 | (2006.01) | |
| B29C 67/20 | (2006.01) | |
| F25B 21/00 | (2006.01) | |

(52) U.S. Cl.
CPC ...... B29C 66/7422 (2013.01); B29C 44/1209 (2013.01); B29C 67/202 (2013.01); C04B 35/10 (2013.01); C04B 35/6344 (2013.01); C04B 35/63436 (2013.01); C04B 35/64 (2013.01); C08J 3/11 (2013.01); C25D 11/045 (2013.01); C25D 11/18 (2013.01); H01L 41/193 (2013.01); H01L 41/45 (2013.01); C04B 2235/3217 (2013.01); C04B 2235/48 (2013.01); C04B 2235/616 (2013.01); C04B 2235/6567 (2013.01); C08J 2327/12 (2013.01); C08J 2327/16 (2013.01); C08J 2327/18 (2013.01); F25B 21/00 (2013.01); F25B 2321/001 (2013.01)

(58) Field of Classification Search
CPC .................................................. B29C 66/7422
See application file for complete search history.

(56) References Cited

U.S. PATENT DOCUMENTS

| | | | | |
|---|---|---|---|---|
| 7,816,601 B2* | 10/2010 | Carver | ............. | H01L 37/00 136/201 |
| 8,093,786 B2* | 1/2012 | Shi | ............. | H01L 41/1876 29/25.35 |
| 9,270,207 B2* | 2/2016 | Sohn | ............. | H01L 41/45 |

FOREIGN PATENT DOCUMENTS

| | | | |
|---|---|---|---|
| CN | 103539956 A | * | 1/2014 |
| CN | 103881119 A | * | 6/2014 |
| CN | 105540535 A | * | 5/2016 |
| WO | WO-2018156079 A1 | * | 8/2018 ........... B06B 1/0622 |

OTHER PUBLICATIONS

Liew et al., Piezoelectric Nanotube Array for Broadband High-Frequency Ultrasonic Transducer, IEEE Transactions on Ultrasonics, Ferroelectrics, and Frequency Control, vol. 65, No. 3, 457-464, Available online Dec. 2017. (Year: 2017).*

Miao et al., Electrochemically Induced Sol-Gel Preparation of Single-Crystalline TiO2 Nanowires, Nano Letters 2002, vol. 2, No. 7, 717-720. (Year: 2002).*

* cited by examiner

*Primary Examiner* — Atul P. Khare
(74) *Attorney, Agent, or Firm* — Maier & Maier, PLLC

(57) ABSTRACT

A ferroelectric polymer electrocaloric nanowire array and a preparation method thereof, in which the ferroelectric polymer electrocaloric material is formed by a polyvinylidene fluoride (PVDF)-based ferroelectric polymer electrocaloric nanowire array embedded in a porous anodic aluminum oxide (AAO) template. The PVDF-based ferroelectric polymer electrocaloric material is controlled to form a nanowire array embedded in the porous AAO template, and through adopting of a solution infiltration method to prepare the ferroelectric polymer electrocaloric nanowire array in the porous AAO template and improvement of the key morphology, structure, internal microscopic connection construction of the ferroelectric polymer, problems, such as low electrocaloric strength of the ferroelectric polymer, difficult heat conduction in the electrocaloric material and low refrigerating power density of the electrocaloric device in the prior art, can be effectively solved.

9 Claims, 2 Drawing Sheets

FERROELECTRIC POLYMER ELECTROCALORIC MATERIAL AND PREPARATION METHOD THEREOF

FIELD

The invention belongs to the field of refrigeration technique, more particularly relates to a ferroelectric polymer electrocaloric material and a preparation method thereof, in which the prepared electrocaloric material can be used for a novel solid-state refrigeration technique, and especially relates to a ferroelectric polymer electrocaloric nanowire array and a preparation method thereof.

BACKGROUND

The refrigeration technique is widely used in industry, military, medical and daily life. At present, most refrigeration equipments use traditional compression refrigeration techniques. However, such refrigeration methods have problems such as low refrigerating efficiency and difficulty in miniaturization of equipment, and refrigerants used in compression refrigeration may cause serious damage to the environment. Thus, there is urgent need to develop a novel refrigeration method.

Electrocaloric refrigeration is a novel refrigeration method. An external electric field is applied to the electrocaloric material to stimulate phase transition in the electrocaloric material, and thus refrigeration is achieved by the heat absorption effect caused by the phase transition. Electrocaloric refrigeration belongs to solid-state refrigeration and does not need refrigerants that are harmful to the environment. Furthermore, electrocaloric refrigeration features high refrigerating efficiency, low energy consumption, easy miniaturization and so on, and thus attracts extensive attention in the field of refrigeration technique. In recent years, the ferroelectric polymer exhibits a strong electrocaloric effect, is easy-to-form and lightweight, and thus becomes one of the important materials for electrocaloric refrigeration devices and techniques.

However, the ferroelectric polymer has a low electrocaloric strength (that is, a stronger electrocaloric effect need to be stimulated by a higher electric field), which brings great difficulty to the design of electrocaloric refrigeration device and reduces the stability and reliability of the device. Meanwhile, the ferroelectric polymer has a low thermal conductivity, namely, heat conduction in the electrocaloric material is difficult, which seriously restricts the refrigerating power density of the electrocaloric device. Therefore, it is of great significance to develop an electrocaloric material with a strong electrocaloric effect and a good thermal conductivity under a low electric field.

SUMMARY

In view of the above-described problems, the present invention provides a ferroelectric polymer electrocaloric material and a preparation method thereof, in which problems, such as low electrocaloric strength of the ferroelectric polymer, difficult heat conduction in the electrocaloric material and low refrigerating power density of the electrocaloric device in the prior art, can be effectively solved through improving the key morphology, structure, internal microscopic connection construction (especially the corresponding heat conduction micro-mechanism) of the ferroelectric polymer as well as the overall process design of the corresponding preparation method and conditions and parameters in respective key steps. In the present invention, the PVDF-based ferroelectric polymer electrocaloric material is controlled to form a nanowire array embedded in the porous AAO template, and through adopting a solution infiltration method to prepare the ferroelectric polymer electrocaloric nanowire array in the porous AAO template, on the one hand, the nanoconfinement effect of the porous AAO template is used to induce change of the crystallization behavior of the ferroelectric polymer so as to improve its electrocaloric effect, and on the other hand, the AAO tube wall with high thermal conductivity is used as a high-speed heat conduction channel to accelerate heat transfer between the electrocaloric material and the cold/hot end and improve the refrigerating power density of the electrocaloric material during operation, so that the ferroelectric polymer electrocaloric material has a strong electrocaloric effect and a good heat transfer capability under a low electric field, and is particularly suitable for novel solid-state refrigeration. In addition, the method has a simple preparation process, is easy to implement and thus has important application value and good application prospect in the electrocaloric refrigeration field.

In order to achieve the above objective, according to an aspect of the present invention, there is provided a ferroelectric polymer electrocaloric material, wherein the ferroelectric polymer electrocaloric material is formed by a polyvinylidene fluoride (PVDF)-based ferroelectric polymer electrocaloric nanowire array embedded in a porous anodic aluminum oxide (AAO) template.

Preferably, the PVDF-based ferroelectric polymer is poly(vinylidene fluoride-trifluoroethylene) (P(VDF-TrFE)) or poly(vinylidene fluoride-trifluoroethylene-chlorofluoroethylene) (P(VDF-TrFE-CFE)); and preferably, the porous AAO template has a pore diameter of 30 nm to 450 nm and a thickness of 10 μm to 500 μm.

According to another aspect of the present invention, there is provided a preparation method of a ferroelectric polymer electrocaloric material, comprising:

A, annealing a porous anodic aluminum oxide (AAO) template;

B, dissolving a polyvinylidene fluoride (PVDF)-based ferroelectric polymer as raw material into a solvent to obtain a homogeneously mixed ferroelectric polymer solution;

C, allowing the ferroelectric polymer solution to infiltrate and penetrate through pores of the porous AAO template obtained in the step A;

D, volatilizing the solvent in the ferroelectric polymer solution in the porous AAO template under the vacuum heating condition; and E, annealing the porous AAO template obtained in the step D in an oven so that a ferroelectric polymer electrocaloric material in the porous AAO template is obtained.

Preferably, the reparation method of the ferroelectric polymer electrocaloric material further comprises:

F, preparing electrodes on upper and lower surfaces of the porous AAO template obtained in the step E, respectively, such that the ferroelectric polymer electrocaloric material in any pore in the porous AAO template is connected to the electrode on the upper surface and the electrode on the upper surface.

Preferably, in the step A, the porous AAO template is prepared by an electrochemical method, and has a pore diameter of 30 nm to 450 nm and a thickness of 10 μm to 500 μm.

Preferably, in the step A, the annealing temperature is 600 deg C. to 1300 deg C.

Preferably, in the step B, the PVDF-based ferroelectric polymer is poly(vinylidene fluoride-trifluoroethylene) (P(VDF-TrFE)) or poly(vinylidene fluoride-trifluoroethylene-chlorofluoroethylene) (P(VDF-TrFE-CFE)); and preferably, in the step B, the solvent is an organic solvent, and is preferably any one or a mixture of any of N-methylpyrrolidone (NMP), dimethylacetamide (DMAc), N,N-dimethylformamide (DMF), triethyl phosphate (TEP) and dimethysulfide (DMS).

Preferably, the ferroelectric polymer solution obtained in the step B has a concentration of 5 wt % to 40 wt %.

Preferably, in the step C, the ferroelectric polymer solution is cast on the surface of the porous AAO template to allow the solution to infiltrate and penetrate through the pores of the porous AAO template.

Preferably, in the step D, the volatilizing process is carried out at a temperature of 30 deg C. to 100 deg C. with a holding time of 2 hours to 24 hours.

Preferably, in the step E, the annealing process is carried out at a temperature of 60 deg C. to 160 deg C. for 5 hours to 28 hours.

Compared with the prior art, in the present invention, the PVDF-based ferroelectric polymer electrocaloric material is controlled to form a nanowire array, and different from the traditional template method in which the porous AAO template is removed after the nanowire array is prepared, in the present invention, the porous AAO template is first annealed (with a preferred annealing temperature) to increase its thermal conductivity, reserving the porous AAO template to allow the nanowire array to be embedded in the porous AAO template. Then, with the porous AAO template as the internal microscopic connection construction of the electrocaloric material to form corresponding heat conduction micro-mechanism, the morphology and structure (e.g., the length and diameter of the nanowire) of the PVDF-based ferroelectric polymer nanowire array, i.e., the pore morphology and structure (e.g., the pore diameter and thickness) of the porous AAO template, are further optimized, thereby (1) increasing the electrocaloric strength of the ferroelectric polymer electrocaloric material such that it has a strong electrocaloric effect under a low electric field; and (2) solving the problem of difficult heat transfer in the ferroelectric polymer.

Compared with the traditional ferroelectric polymer film electrocaloric material, for the first time, the electrocaloric strength of the ferroelectric polymer electrocaloric material is increased by 3 times (see Table 1, the ferroelectric polymer nanowire array targeted in Table 1 corresponds to the subsequent embodiment 1 of the present invention). In addition, in the present invention, by the annealing treatment, the thermal conductivity of the porous AAO template is increased and thus the refrigerating power density of the electrocaloric material can be effectively improved. For example, in a case where the traditional ferroelectric polymer film and the nanowire array embedded in the porous AAO template have the same thickness of 100 µm, the full heat transfer time of the electrocaloric material is reduced from 500 ms to 30 ms, and the refrigerating power density of the electrocaloric material at an operating frequency of 25 Hz is increased by 5 times (see in Table 1).

Table 1 electrocaloric performance comparison between the ferroelectric polymer nanowire array and the film

| | | Film | Nanowire array |
|---|---|---|---|
| Electrocaloric effect | Q $(MJ \cdot m^{-3})$ | 1.75 | 6.70 |
| | $\Delta T$ (° C.) | 0.80 | 2.45 |
| | $\Delta S$ $(KJ \cdot m^{-3} \cdot K^{-1})$ | 7.5 | 22.50 |
| Electrocaloric strength | $|Q/\Delta E|$ $(KJ \cdot MV^{-1} \cdot m^{-2})$ | 44 | 132 |
| | $|\Delta T/\Delta E|$ $(mK \cdot m \cdot MV^{-1})$ | 16 | 50 |
| | $|\Delta S/\Delta E|$ $(J \cdot MV^{-1} \cdot m^{-2} \cdot K^{-1})$ | 150 | 450 |
| Refrigerating power density $(W \cdot cm^{-3})$ | | 17.7 | 88.6 |

Further, the present invention also optimizes the key annealing process in the preparation method, in which the annealing temperature of the porous AAO template is preferably 600 degrees C. to 1300 degrees C., and the whole annealing temperature of the subsequently formed porous AAO template, in which the ferroelectric polymer electrocaloric nanowire array (i.e., electrocaloric material) is embedded, is preferably 60 degrees C. to 160 degrees C. By controlling various parameters, the overall structural defects of the electrocaloric material can be effectively reduced, thereby increasing the electrocaloric strength and the refrigerating power density.

DETAILED DESCRIPTION

Figure 1:
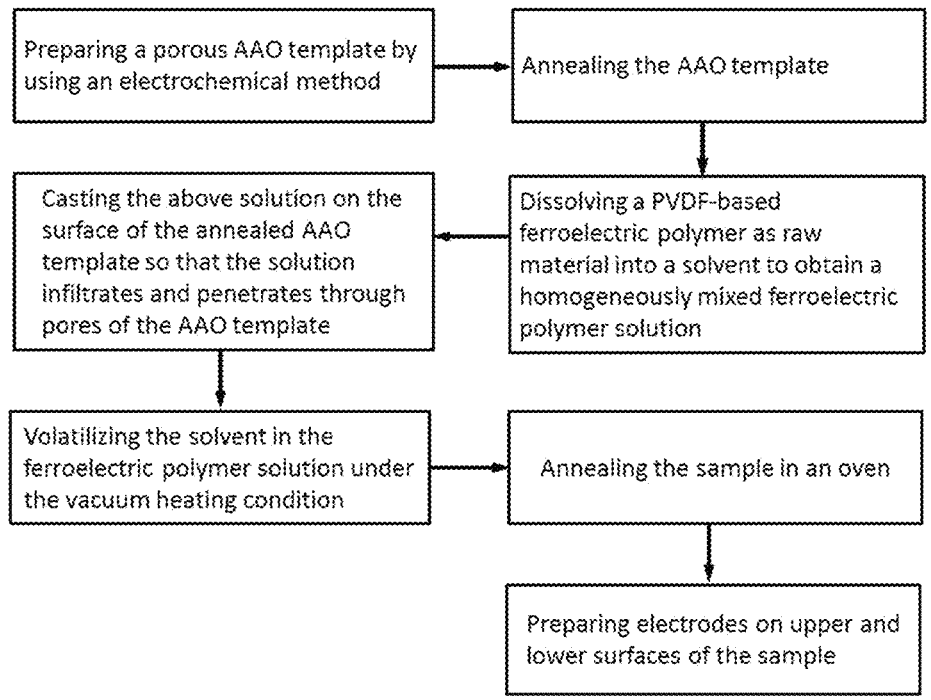
FIG. 1 is a flowchart of steps of a method according to the present invention.
Figure 2:
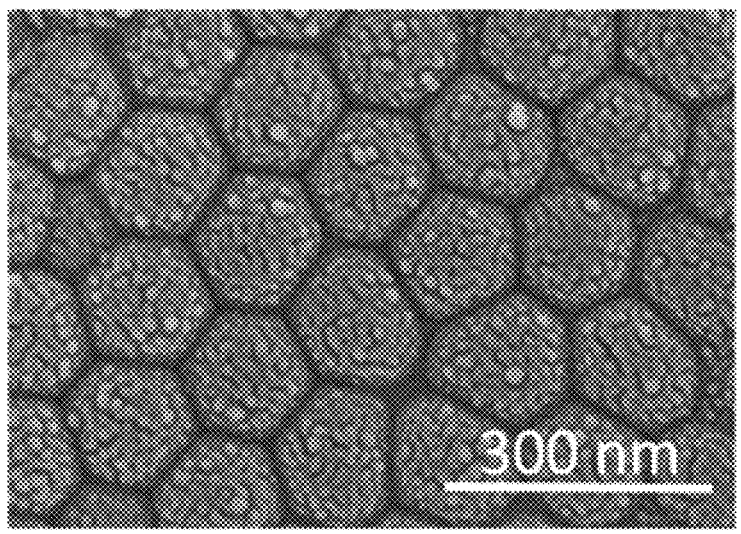
FIG. 2 is a scanning electron microscopic photograph of the surface of a ferroelectric polymer nanowire array embedded in the porous AAO template.
Figure 3:
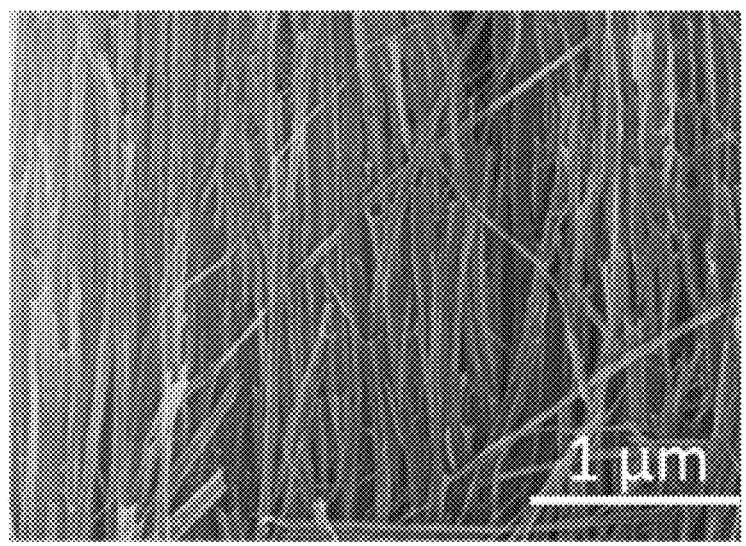
FIG. 3 is a scanning electron microscopic photograph of the surface of the ferroelectric polymer nanowire array after the porous AAO template is removed.

For clear understanding of the objectives, features and advantages of the present invention, detailed description of the present invention will be given below in conjunction with accompanying drawings and specific embodiments. It should be noted that the embodiments described herein are only meant to explain the present invention, and not to limit the scope of the present invention.

The electrocaloric material in the present invention is formed by a PVDF-based ferroelectric polymer electrocaloric nanowire array embedded in a porous AAO template. In the PVDF-based ferroelectric polymer electrocaloric nanowire array, the polymer may be preferably at least one of poly(vinylidene fluoride-trifluoroethylene) (P(VDF-TrFE)) and poly(vinylidene fluoride-trifluoroethylene-chlorofluoroethylene) (P(VDF-TrFE-CFE)). Preferably, the porous AAO template has a pore diameter of 30 nm to 450 nm and a thickness of 10 µm to 500 µm. The electrocaloric material can be prepared according the following steps:

A, by using an electrochemical method, preparing a porous AAO template with a pore diameter of 30 nm to 450 nm and a thickness of 10 µm to 500 µm;

B, annealing the porous AAO template at 600 deg C. to 1300 deg C.;

C, dissolving P(VDF-TrFE) or P(VDF-TrFE-CFE) as raw material into a solvent to obtain a solution with a concentration of 5 wt % to 40 wt %;

D, casting the above solution on the surface of the annealed porous AAO template, so that the solution infiltrates and penetrates through the pores of the porous AAO template;

E, placing the sample in a vacuum chamber at 30 deg C. to 100 deg C. to dry for 2 hours to 24 hours so as to volatilize the solvent in the ferroelectric polymer solution;

F, annealing the sample in an oven at 60 deg C. to 160 deg C. for 5 hours to 28 hours; and G, preparing electrodes on the top and bottom surfaces of the sample.

The following are specific embodiments.

Embodiment 1

A, preparing the porous AAO template, which specifically includes the following steps:

a, annealing an aluminum foil at 400 deg C. with a holding time of 2 hours, which is conducive to the subsequent formation of a regular porous structure;

b, ultrasonically cleaning the aluminum foil in toluene and ethanol for 10 minutes successively;

c, by using a steel plate as a cathode and the aluminum foil as an anode, electrochemically polishing the aluminum foil in a solution of perchloric acid and ethanol with a volume ratio of 1:4 at a voltage of 20 V;

d, by using the polished aluminum foil as the anode and the steel plate as the cathode, performing first oxidation treatment on the aluminum foil in an oxalic acid solution with a concentration of 0.3 mol/L at a reaction voltage of 60 V with a reaction time of 1 hour;

e, immersing the aluminum foil subjected to the first oxidation into a mixed solution of 6 wt % phosphoric acid and 1.8 wt % chromic acid, and then placing it in an oven at 80 deg C. with a reaction time of 0.5 hour to remove the surface oxide formed by the first oxidation treatment;

f, by using the aluminum foil subjected to the above treatments as the anode and the steel plate as the cathode, performing second oxidation treatment on the aluminum foil in an oxalic acid solution with a concentration of 0.3 mol/L at a reaction voltage of 60 V with a reaction time of 3 hours; and g, placing the porous AAO template generated by the second oxidation in a saturated copper sulfate solution to remove the remaining aluminum substrate, and then immersing it in a 5 wt % phosphoric acid solution for 30 minutes to remove a barrier layer and broaden pores, so as to obtain a porous AAO template with highly ordered pores.

B, performing high temperature annealing on the porous AAO template prepared in the step A at 850 deg C. with a holding time of 2 hours.

C, dissolving P(VDF-TrFE-CFE) ferroelectric polymer into DMF to obtain a P(VDF-TrFE-CFE)-DMF solution with a concentration of 30 wt %, during which a magnetic stirrer is used to stir for 24 hours so as to fully dissolve P(VDF-TrFE-CFE).

D, casting the above solution onto the surface of the annealed porous AAO template, so that the solution infiltrates and penetrates through the pores of the porous AAO template.

E, placing the sample in a vacuum chamber at 60 deg C. to dry for 24 hours so as to volatilize the DMF.

F, annealing the sample in an oven at 100 deg C. for 22 hours.

G, preparing electrodes on the top and bottom surfaces of the sample by using an ion sputtering method.

Embodiment 2

The process in the embodiment 2 is the same as the process in the embodiment 1 except that in the step A, the first oxidation is performed at a voltage of 25 V with a reaction time of 6 hours, and the second oxidation process is performed at a voltage of 25 V with a reaction time of 20 hours.

Embodiment 3

The process in the embodiment 3 is the same as the process in the embodiment 1 except that in the step A, the electrochemical reaction solution is a phosphoric acid solution with a concentration of 0.3 mol/L, the first oxidation is performed at a voltage of 195 V with a reaction time of 6 hours, and the second oxidation is performed at a voltage of 195 V with a reaction time of 20 hours.

Embodiment 4

The process in the embodiment 4 is the same as the process in the embodiment 1 except that in the step A, the second oxidation process is performed with a reaction time of 0.3 hours.

Embodiment 5

The process in the embodiment 5 is the same as the process in the embodiment 1 except that in the step A, the second oxidation process is performed with a reaction time 15 hours.

Embodiment 6

The process in the embodiment 6 is the same as the process in the embodiment 1 except that in the step B, the annealing temperature of the porous AAO template is 600 deg C.

Embodiment 7

The process in the embodiment 7 is the same as the process in the embodiment 1 except that in the step B, the annealing temperature of the porous AAO template is 1300 deg C.

Embodiment 8

The process in the embodiment 8 is the same as the process in the embodiment 1 except that in the step B, the annealing time of the porous AAO template is 6 hours.

Embodiment 9

The process in the embodiment 9 is the same as the process in the embodiment 1 except that in the step C, the solvent is DMAc.

Embodiment 10

The process in the embodiment 10 is the same as the process in the embodiment 1 except that in the step C, the solution concentration is 5 wt %.

Embodiment 11

The process in the embodiment 11 is the same as the process in the embodiment 1 except that in the step C, the solution concentration is 40 wt %.

Embodiment 12

The process in the embodiment 12 is the same as the process in the embodiment 1 except that in the step E, the sample is placed in a vacuum chamber at 30 deg C. to dry.

Embodiment 13

The process in the embodiment 13 is the same as the process in the embodiment 1 except that in the step E, the sample is placed in a vacuum chamber at 100 deg C. to dry.

Embodiment 14

The process in the embodiment 14 is the same as the process in the embodiment 1 except that in the step E, the sample is placed in a vacuum chamber at 100 deg C. to dry for 2 hours.

Embodiment 15

The process in the embodiment 15 is the same as the process in the embodiment 1 except that in the step F, the annealing temperature of the sample is 60 deg C.

Embodiment 16

The process in the embodiment 16 is the same as the process in the embodiment 1 except that in the step F, the annealing time of the sample is 5 hours.

Embodiment 17

The process in the embodiment 17 is the same as the process in the embodiment 1 except that in the step F, the annealing time of the sample is 28 hours.

Embodiment 18

The process in the embodiment 18 is the same as the process in the embodiment 1 except that in the step C, the ferroelectric polymer is P(VDF-TrFE), and in the step F, the annealing temperature of the sample is 160 deg C.

The properties of the electrocaloric materials prepared in the above embodiments were tested, and test results under an electric field of 50 MV/m are shown in Table 2.

Table 2 comparison of electrocaloric properties (EP) of the embodiments

| | EP | | | | | | |
|---|---|---|---|---|---|---|---|
| | Electrocaloric effect | | | Electrocaloric strength | | | |
| Embodiment | Q (MJ·m$^{-3}$) | ΔT (°C.) | ΔS (KJ·m$^{-3}$·K$^{-1}$) | |Q/ΔE| (KJ·MV$^{-1}$·m$^{-2}$) | |ΔT/ΔE| (mK·m·MV$^{-1}$) | |ΔS/ΔE| (J·MV$^{-1}$·m$^{-2}$·K$^{-1}$) | Refrigerating power density[1] (W·cm$^{-3}$) |
| 1 | 6.70 | 2.45 | 22.50 | 132.00 | 50.00 | 450.00 | 88.60 |
| 2 | 1.15 | 0.42 | 3.86 | 22.64 | 8.57 | 77.15 | 5.50 |
| 3 | 2.41 | 0.88 | 8.11 | 47.62 | 18.02 | 162.30 | 41.48 |
| 4 | 6.83 | 2.50 | 22.95 | 134.75 | 51.00 | 459.25 | 90.25 |
| 5 | 5.90 | 2.16 | 19.83 | 116.42 | 44.06 | 396.79 | 74.86 |
| 6 | 6.35 | 2.33 | 21.34 | 125.32 | 47.43 | 427.10 | 27.01 |
| 7 | 6.42 | 2.35 | 21.57 | 126.67 | 47.94 | 431.70 | 89.77 |
| 8 | 7.08 | 2.59 | 23.79 | 139.71 | 52.88 | 476.15 | 93.57 |
| 9 | 6.85 | 2.51 | 23.04 | 135.29 | 51.20 | 461.09 | 90.61 |
| 10 | 4.41 | 1.62 | 14.83 | 87.10 | 32.97 | 296.86 | 58.34 |
| 11 | 4.24 | 1.94 | 14.24 | 83.62 | 31.65 | 284.98 | 70.01 |
| 12 | 4.83 | 1.77 | 16.23 | 95.30 | 36.07 | 324.78 | 63.82 |
| 13 | 5.50 | 2.01 | 18.49 | 108.56 | 41.09 | 369.97 | 72.70 |
| 14 | 3.78 | 1.39 | 12.72 | 74.71 | 28.27 | 254.61 | 50.03 |
| 15 | 1.37 | 0.50 | 4.62 | 27.14 | 10.27 | 92.49 | 18.18 |
| 16 | 1.17 | 0.43 | 3.92 | 23.04 | 8.72 | 78.53 | 15.43 |
| 17 | 6.37 | 2.33 | 21.38 | 125.40 | 47.50 | 427.50 | 84.17 |
| 18 | 7.30 | 2.67 | 24.54 | 144.07 | 54.53 | 491.03 | — |

[1]the operating frequency is 25 Hz.

According to the above table, it can be seen from the comparison of the embodiments that the pore diameter and thickness of the porous AAO template, the annealing temperature and time of the porous AAO template, the types of polymer and solvent, the solution concentration, the drying temperature and time and the annealing temperature and time all can affect properties of the material.

While particular embodiments of the present invention have been shown and described, it will be obvious to those skilled in the art that changes and modifications may be made without departing from the spirit and scope of the present invention.

What is claimed is:

1. A preparation method of a ferroelectric polymer electrocaloric material embedded in a porous anodic aluminum oxide (AAO) template, the method comprising the following steps of:

A, annealing a porous AAO template at an annealing temperature of 600 deg C. to 1300 deg C. so as to increase thermal conductivity of the porous AAO template;

B, dissolving a polyvinylidene fluoride (PVDF)-based ferroelectric polymer as raw material into a solvent to obtain a homogeneously mixed ferroelectric polymer solution;

C, allowing the ferroelectric polymer solution to infiltrate and penetrate through pores of the annealed porous AAO template obtained in step A;

D, volatilizing the solvent of the ferroelectric polymer solution in the porous AAO template under vacuum heating conditions; and E, annealing the porous AAO template obtained in step D in an oven so that a ferroelectric polymer electrocaloric material embedded in the porous AAO template is obtained, wherein the porous AAO template obtained in step E is configured for use along with the embedded material in a refrigeration device as a high-speed heat conductor.

2. The preparation method of claim 1, wherein the preparation method further comprises:

F, preparing electrodes on upper and lower surfaces of the porous AAO template obtained in step E, respectively, such that portions of the embedded ferroelectric polymer electrocaloric material as present in any respective pore in the porous AAO template is connected to the electrode on the upper surface and to the electrode on the lower surface.

3. The preparation method of claim 1, wherein the porous AAO template of step A is prepared by an electrochemical method, and has a pore diameter of 30 nm to 450 nm and a thickness of 10 μm to 500 μm.

4. The preparation method of claim 1, wherein in step B, the PVDF-based ferroelectric polymer is poly(vinylidene fluoride-trifluoroethylene) (P(VDF-TrFE)) or poly(vinylidene fluoride-trifluoroethylene-chlorofluoroethylene) (P(VDF-TrFE-CFE));

in step B, the solvent is an organic solvent, which is any one or a mixture of any of N-methylpyrrolidone (NMP), dimethylacetamide (DMAc), N,N-dimethylformamide (DMF), triethyl phosphate (TEP), and dimethysulfide (DMS); and the PVDF-based ferroelectric polymer of the ferroelectric polymer solution obtained in step B has a concentration of 5 wt % to 40 wt %.

5. The preparation method of claim 1, wherein in step C, the ferroelectric polymer solution is cast on the surface of the porous AAO template to allow the solution to infiltrate and penetrate through the pores of the porous AAO template.

6. The preparation method of claim 1, wherein in step D, the volatilizing process is carried out at a temperature of 30 deg C. to 100 deg C. with a holding time of 2 hours to 24 hours.

7. The preparation method of claim 1, wherein in step E, the annealing process is carried out at a temperature of 60 deg C. to 160 deg C. for 5 hours to 28 hours.

8. The preparation method of claim 1, wherein the porous AAO template provides a nanoconfinement effect inducing a change of the crystallization behavior of the ferroelectric polymer so as to improve its electrocaloric effect.

9. The preparation method of claim 1, wherein the embedded polymer material is in the form of an embedded electrocaloric nanowire array.

* * * * *